(12) United States Patent
Hickman et al.

(10) Patent No.: US 9,651,579 B2
(45) Date of Patent: May 16, 2017

(54) MULTI-SCOPE CONTROL AND SYNCHRONIZATION SYSTEM

(71) Applicant: Tektronix, Inc., Beaverton, OR (US)

(72) Inventors: Barton T. Hickman, Portland, OR (US); Jed H. Andrews, Aloha, OR (US); Jeffrey W. Mucha, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 14/724,302

(22) Filed: May 28, 2015

(65) Prior Publication Data

US 2016/0077131 A1 Mar. 17, 2016

Related U.S. Application Data

(60) Provisional application No. 62/049,966, filed on Sep. 12, 2014.

(51) Int. Cl.
| | |
|---|---|
| *H04L 7/00* | (2006.01) |
| *G01R 13/32* | (2006.01) |
| *H03L 7/24* | (2006.01) |
| *G01R 13/02* | (2006.01) |

(52) U.S. Cl.
CPC ......... *G01R 13/32* (2013.01); *G01R 13/0254* (2013.01); *H03L 7/24* (2013.01)

(58) Field of Classification Search
CPC ..... G01R 13/02; G01R 13/0254; G06F 11/25; H03L 7/00; H04L 1/205
USPC .......................................... 327/144; 375/354
See application file for complete search history.

(56) References Cited

U.S. PATENT DOCUMENTS

| | | | |
|---|---|---|---|
| 8,705,677 B2 | 4/2014 | Delbue et al. | |
| 8,705,678 B1 | 4/2014 | Delbue et al. | |
| 2006/0106565 A1 | 5/2006 | Dobyns | |
| 2008/0310315 A1* | 12/2008 | Antonin | H04L 1/205 370/248 |
| 2011/0191066 A1 | 8/2011 | Delbue et al. | |
| 2011/0267036 A1 | 11/2011 | Kharrati et al. | |
| 2013/0076409 A1 | 3/2013 | Delbue et al. | |

OTHER PUBLICATIONS

European Search Report, Mar. 9, 2016, 6 pages, EP Application No. 15184838.9, European Patent Office, Munich, Germany.

\* cited by examiner

*Primary Examiner* — David S Huang
(74) *Attorney, Agent, or Firm* — Michael A. Nelson; Kevin D. Dothager; Marger Johnson

(57) ABSTRACT

A test and measurement system for synchronizing multiple oscilloscopes including a host oscilloscope and at least one client oscilloscope. The host oscilloscope includes a host timebase clock configured to output a clock signal, a host digitizer including a digitizer synchronization clock based on the clock signal, and a host acquisition controller includes a trigger synchronization clock based the clock signal and outputs a run signal to begin an acquisition of an input signal. Each client oscilloscope includes a client timebase clock configured to receive the clock signal from the host timebase clock and output the clock signal, a client digitizer including a digitizer synchronization clock based on the clock signal, and a client acquisition controller includes a trigger synchronization clock based on the clock signal and receives the run signal from the host acquisition controller and begins an acquisition of another input signal based on the run signal.

14 Claims, 6 Drawing Sheets

MULTI-SCOPE CONTROL AND SYNCHRONIZATION SYSTEM

BENEFIT

This application claims benefit of U.S. Provisional Application No. 62/049,966, filed Sep. 12, 2014, titled MULTI-SCOPE CONTROL AND SYNCHRONIZATION SYSTEM, which is incorporated herein by reference in its entirety.

TECHNICAL FIELD

This disclosure relates to providing a signal acquisition system that contains more than four channels by synchronizing multiple oscilloscopes.

BACKGROUND

Conventionally, to synchronize the acquisitions of multiple oscilloscopes, the trigger signal is simply fanned out to all of the oscilloscopes. However, with such a configuration, the synchronization jitter between the oscilloscopes is the sum of the individual trigger jitters of the two oscilloscopes. This may be in the range of about 1-2 ps rms. Further, it is often difficult to fan out the trigger if a probe must be used to access it. In that case, a separate probe is needed for each oscilloscope, thus placing extra loading on the trigger signal which may slow down the trigger signal and cause even more trigger jitter or even impact the operation of the device under test.

Additionally, the time-bases of the multiple oscilloscopes could be phase locked so that the waveform records would remain synchronized for a longer time period after the trigger.

Embodiments of the invention address these and other limitations in the prior art.

SUMMARY

Certain embodiments of the disclosed technology include a test and measurement system for synchronizing multiple oscilloscopes including a host oscilloscope and at least one client oscilloscope. The host oscilloscope includes a host timebase clock configured to output a clock signal, a host digitizer including a digitizer synchronization clock based on the clock signal, and a host acquisition controller including a trigger synchronization clock based on the clock signal, the host acquisition controller configured to output an AcqReady signal to indicate all scopes are ready to begin an acquisition and output a run signal to begin an acquisition of an input signal. Each client oscilloscope includes a client timebase clock configured to receive the clock signal from the host timebase clock and output the clock signal, a client digitizer including a digitizer synchronization clock based on the clock signal, and a client acquisition controller including a trigger synchronization clock based on the clock signal, each client acquisition controller configured to output an AcqReady signal once it is ready to begin an acquisition and receive the run signal from the host acquisition controller and begin an acquisition of another input signal based on the run signal.

Certain embodiments of the disclosed technology also includes a method for synchronizing a plurality of oscilloscopes, including outputting from a host oscilloscope a host clock signal from a host timebase to a plurality of clients; setting a host digitizer synchronization clock based on the host clock signal; setting a host trigger synchronization clock based on the host clock signal; generating a run signal to begin acquisition of an input signal; outputting the run signal to the plurality of clients to begin acquisition of a corresponding plurality of input signals; and receiving an AcqReady signal from the plurality of clients to indicate they are ready to begin an acquisition.

Certain other embodiments of the disclosed technology include a method for synchronizing a plurality of oscilloscopes, including receiving at a client a host clock signal; setting a client digitizer synchronization clock based on the host clock signal; setting a client trigger synchronization clock based on the host clock signal; outputting an acquisition ready signal to a host; receiving a run signal from the host; and starting an acquisition when the run signal is received.

DETAILED DESCRIPTION

Figure 1:
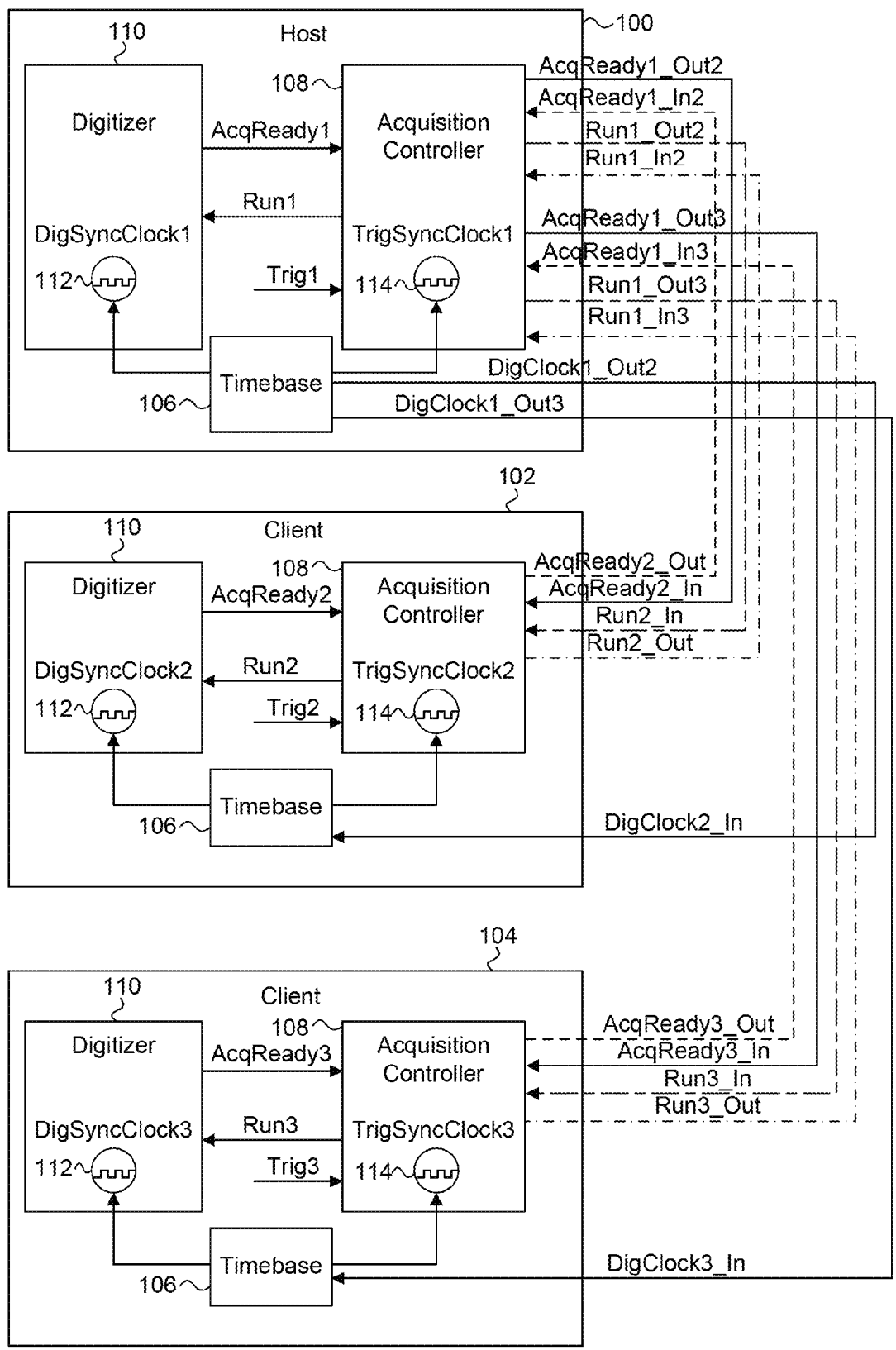
FIG. 1 is a block diagram of a multiple oscilloscope acquisition system according to embodiments of the disclosed technology.

In the drawings, which are not necessarily to scale, like or corresponding elements of the disclosed systems and methods are denoted by the same reference numerals.

Embodiments of the disclosed technology combine multiple oscilloscopes to extend the channel count and allow the multiple oscilloscopes to act as a single scope from a user's perspective. As discussed in more detail below, only a single instance of a trigger event is required and, as a result, trigger jitter between the oscilloscopes is eliminated and the only residual waveform-to-waveform jitter is the uncorrelated short term jitter of the individual digitizers. In other words, the jitter between oscilloscope digitizers in the separate oscilloscopes is comparable to the jitter between the digitizers within a single oscilloscope.

Embodiments of the disclosed technology also enable a logical OR function that provides all of the low jitter benefits without having to know which of the multiple oscilloscopes will initiate the trigger event. This allows multiple oscilloscopes to monitor many signals without knowing which signals will have events.

FIG. 1 illustrates a block diagram of a multiple oscilloscope system, according to some embodiments of the disclosed technology. The system illustrated in FIG. 1 includes a host 100 and two clients 102 and 104. However, the concept may extend easily to an arbitrary number of clients. The control system of one of the oscilloscopes serves as the control system for all of the oscilloscopes. In FIG. 1, the host 100 serves as the control system for clients 102 and 104.

A simplified control system of an oscilloscope is shown in host 100. The control system includes a timebase block 106 that generates the digitizer clocks as well as the clocks sent to the acquisition controller 108.

The digitizer block 110 converts analog waveforms into discrete digital waveforms using multiple digitizers (not shown), and the discrete digital waveforms are saved in memory (not shown). The sample clock for the digitizers is derived from the timebase 106. Digitizer block 110 also includes a slower clock 112, referred to as DigSyncClock1 in the host 100, which is also derived from the timebase 106. The DigSyncClock1 is used for synchronous communication with the acquisition controller 108 and an address generator for the waveform memory.

The disclosed technology, however, does not need an external signal to align the multiple digitizers (not shown) within each Digitizer block 110. This function is performed internally to each oscilloscope, and as such, each oscilloscope is abstracted as a non-interleaved digitizer as far as the multiple-oscilloscope synchronization system is concerned. Thus, the individual client oscilloscopes can then be detached and used as stand-alone oscilloscopes.

The acquisition controller 108 controls the sequencing of the acquisition cycle based on various events. For example, if the user wants to stop the oscilloscope, the acquisition controller 108 will halt the digitizers in the digitizer block 110. If a trigger event occurs, the acquisition controller 108 time-stamps the trigger event and stops the digitizers in the digitizer block 110 after an appropriate amount of post trigger time.

The acquisition controller 108 uses a TrigSyncClock1 114 for synchronous communication with the digitizer block 110 that is also derived from the timebase 106. The TrigSyncClock1 114 and DigSyncClock1 112 are preferably the same frequency; however, the TrigSyncClock1 114 period may be any multiple of the DigSyncClock1 112 period. In fact, to support different models of oscilloscopes that may have different DigSyncClock 112 frequencies, it is necessary for the period of the TrigSyncClock1 114 to be the smallest common multiple of all the DigSyncClock1 112 periods for the connected client oscilloscopes.

A data link (not shown) is present between the oscilloscopes to communicate trigger information from the clients 102 and 104 to the host 100 in the situation when the trigger occurs within one of the clients 102 and 104. The data link also transfers waveform data from the clients 102 and 104 to the host 100 so that the control and display of the waveforms can be aggregated in the host oscilloscope 100, if desired.

As described in more detail below, various control links (also not shown) coordinate power up/down information between oscilloscopes and provides information to the host 100 to have knowledge of the connection state of the system.

The disclosed technology extends the acquisition control system discussed above with respect to host 100 to clients 102 and 104. Clients 102 and 104 also include a digitizer block 110 and an acquisition controller 108. The DigSyncClock 112 and TrigSyncClock 114 are labeled DigSyncClock2 and TrigSyncClock2 for client 102 and DigSyncClock3 and TrigSyncClock3 for client 104 to differentiate the clocks in each of the clients 102 and 104.

Clients 102 and 104 use the timebase 106 from the host 100. That is, DigClock1 is sent out from the host through DigClock1_Out2 to the timebase 106 of client 102 through DigClock2_in. DigClock1 is also sent out from the host through DigClock1_Out3 to the timebase 106 of client 104 through DigClock3_In. That is, both timebases 106 of clients 102 and 104 receive the DigClock signal from the timebase 106 of host 100.

Although FIG. 1 illustrates a system with one host 100 and two clients 102 and 104, the disclosed technology will work with any number of clients. Further, the host 100 and clients 102 and 104 may be identical units and their roles as host and client can be configured either internally or by external cables connected.

FIG. 1 shows the various signals sent to and from each of the host 100 and the clients 102 and 104. These signals will be discussed in more detail below with respect to FIG. 2-4.

Figure 2:
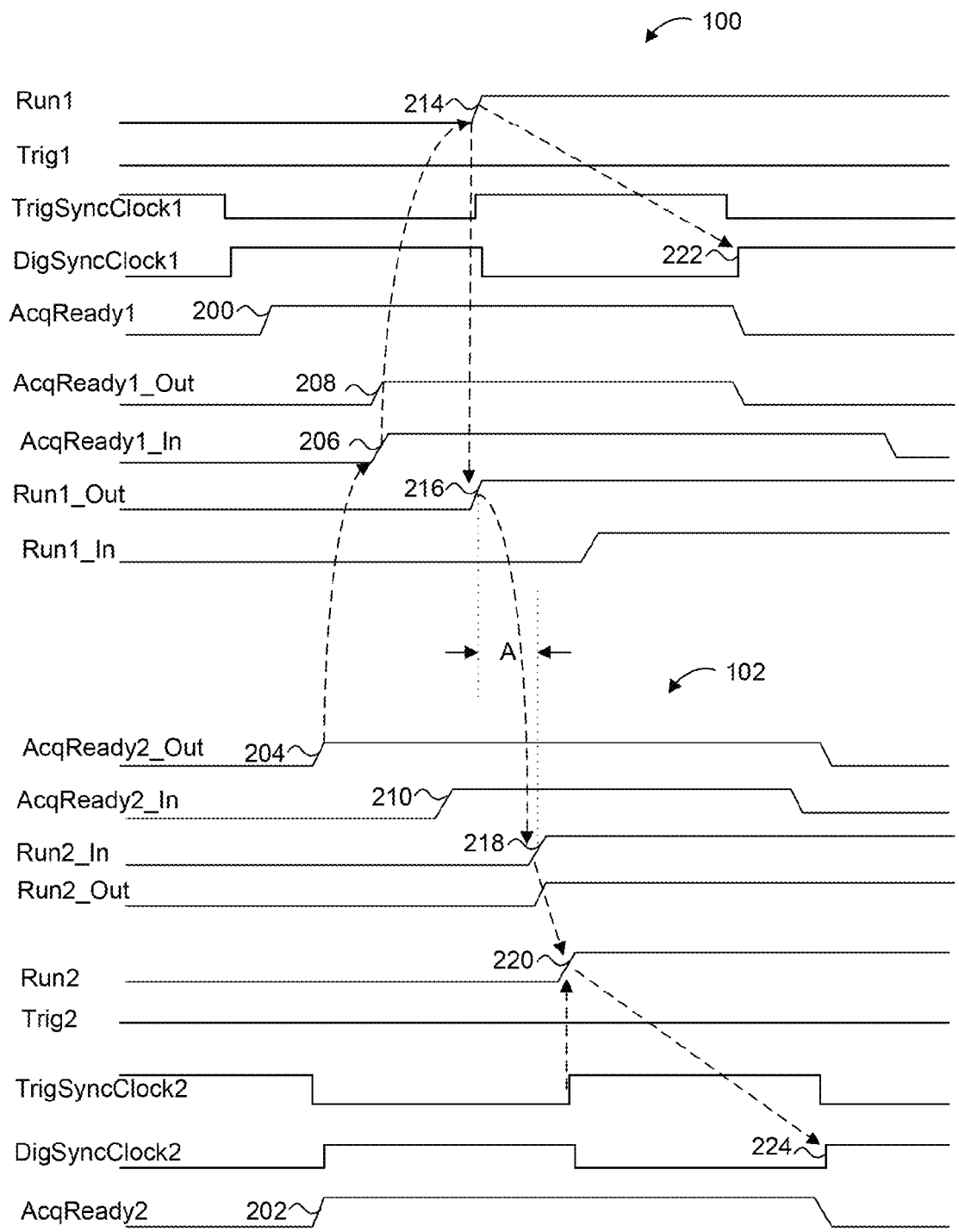
FIG. 2 is a timing diagram of the beginning of a new acquisition cycle for the multiple oscilloscope acquisition system according to FIG. 1.

FIG. 2 illustrates a timing situation for beginning a new acquisition cycle in the system of FIG. 1. For simplicity, only a single host and client are shown in the timing chart. However, the concept extends easily to an arbitrary number of clients.

When an acquisition cycle begins, the host and client need to start the digitizers 110 and then enable trigger events to occur. As soon as any post-processing from a previous acquisition is complete, or upon startup, the Acquisition Controller block 108 of each oscilloscope will assert its respective AcqReady signals 200 and 204. When only a single oscilloscope is used, the AcqReady signal tells the Acquisition Controller 108 to send a Run1 signal to the digitizer 110 to begin storing data to a memory (not shown).

In the multiple oscilloscope configuration of FIG. 1, all of the AcqReady signals are sent to the host 100. That is, AcqReady2_Out is sent to AcqReady1_In2 and AcqReady3_Out is sent to AcqReady1_In3. The host 100 has separate AcqReady1_In/Out pairs for each of the connected clients. As seen in FIG. 1, for example, Host includes an AcqReady1_In2 and AcqReady1_In3 for receiving the AcqReady signals clients 102 and 104, through AcqReady2_Out and AcqReady3_Out, respectively.

Once the host 100 receives all the AcqReady signals from the connected clients, it knows that all clients are ready to begin an acquisition. For example, in FIG. 2, AcqReady1 goes high at 200 indicating that the host 100 is ready for an acquisition. The client issues its AcqReady2 202 signal through AcqReady2_Out 204 when the client is ready for an acquisition. Since AcqReady1 went high at 200 prior to when the AcqReady2_Out 204 signal was received at the AcqReady1_In at 206, AcqReady1_Out goes high at 208 immediately when AcqReady1_In is received at 206. That is, AcqReady1_Out goes high at 208 when all AcqReady1_Ins are received and goes low when any AcqReady goes low.

After the AcqReady1_Out signal 204 has been broadcast, Run1 on the host 100 goes high at 214 on the rising edge of the TrigSyncClock1. When Run1 goes high, Run1_Out also goes high at 216 and broadcasts the Run1 signal to the client devices. This is shown at 218 which goes high when Run1 is received at the Run2_In 218 and Run2 goes high at 220.

After the Run1 signal goes high at 214 and the Run2 signal goes high at 220, the address generator count begins in the host 100 at the next high of the DigSyncClock1 at 222 and in the client 102 at the next high of the DigSyncClock2 at 224.

The system adjusts the phase of the TrigSyncClock2 so that is delayed from the TrigSyncClock1 by the propagation delay of Run1_Out to Run2_In plus some setup time. The propagation delay is shown as A in FIGS. 2 and 3.

As discussed in more detail below, the TrigSyncClock 114 is changeable. It is chosen so that the return signal has just enough set up time from client to host. Latching and sending are both done on the rising edge of the clock. However, the oscilloscopes may also be setup to latch on the falling edge and send on the rising edge and adjust the phases to that the setup time is the same in both directions.

Figure 3:
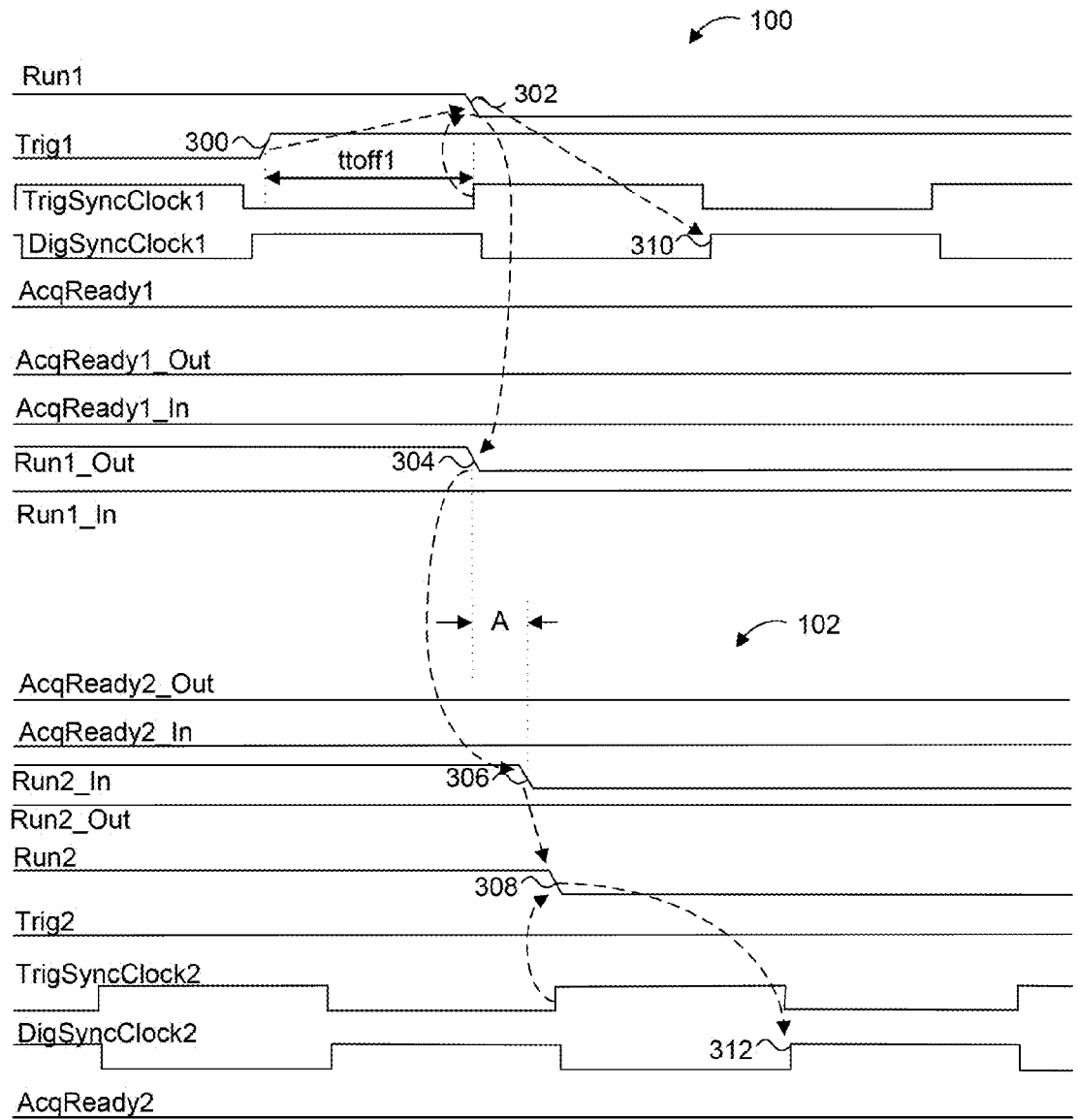
FIG. 3 is a timing diagram of a trigger and end of an acquisition cycle for the multiple oscilloscope acquisition system where the host system generates the trigger according to FIG. 1.

FIG. 3 illustrates a timing chart for when a trigger event occurs. Following from FIG. 2, the acquisition memories in the hosts and clients have been acquiring data for some period of time waiting for a trigger event to occur. Whether the trigger event occurs on the client or on the host, the deassertion of the run signal is sent to the host 100 acquisition controller 108 and from there broadcast back out to the host 100 itself and the clients 102 and 104. The first deassertion of Run that is received by the Host 100 is the one that is used.

As mentioned above, FIG. 3 illustrates a timing chart when the trigger occurs in the host 100. Alternatively, FIG. 4 illustrates a timing chart when the trigger occurs in the client 102.

Starting with FIG. 3, a trigger event occurs at 300 in the host 100. After the trigger event occurs, the Run1 signal goes low 302 at the next high of the TrigSyncClock1. When the Run1 signal is sent out through Run1_Out 304 at the host 100 to the client 102, the client 102 receives the signal at Run2_In and goes low at 306. Due to the phase alignment of the SyncClocks, discussed in more detail below, this happens with unambiguous delays from host to client. In response to Run2_In going low at 306, Run2 goes low at 308 at the next high of the TrigSyncClock2. When Run1 and Run2 go low at 302 and 308, respectively, the post-trigger counter starts at the next high of the DigSyncClock1 and DigSyncClock2, respectively, at 310 and 312.

Figure 4:
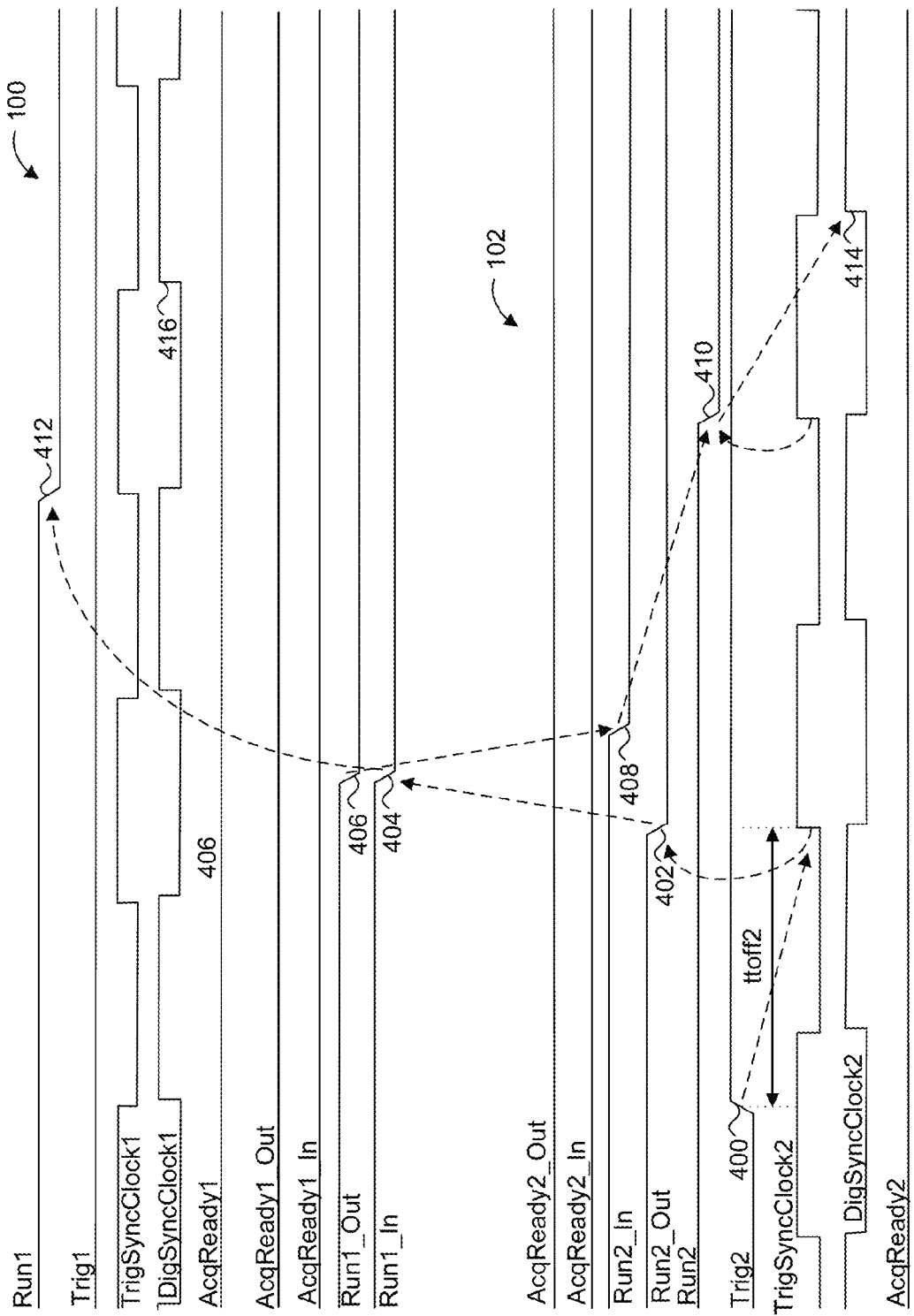
FIG. 4 is a timing diagram of a trigger and end of a cycle for the multiple oscilloscope acquisition system where the client system generates the trigger according to FIG. 1.

In FIG. 4, the trigger event 400 occurs at the client. The run deassertion is first sent to the host via Run2_Out going low at 402 and is received at Run1_In at 404. Then the system proceeds as it did when the trigger occurred in the host, as in FIG. 3. When the Run2_Out signal 402 from the client is received at the Run1_In at 404, the host 100 immediately broadcasts the Run1_Out signal to the client by going low at 406. If multiple clients are in the system, as discussed above, this Run1_Out is sent to all the clients. The client receives the signal at Run2_In and goes low at 408. In response to Run2_In going low at 408, Run2 goes low at 410 at the next high of the TrigSyncClock2 while Run1 goes low at 412 at the next high of the TrigSyncClock1. When Run1 and Run2 go low at 410 and 412, respectively, the post-trigger counter starts at the next high of the DigSyncClock1 and DigSyncClock2, respectively, at 414 and 416.

When the trigger occurs in an oscilloscope, that oscilloscope, either the host or one of the clients, computes the timestamp of that trigger relative to its local TrigSyncClock. In FIG. 3 this timestamp is ttoff1 and in FIG. 4 the timestamp is ttoff2.

After an acquisition cycle is complete, the timestamp, ttoff, is sent to the host for processing. This may be ttoff1 or ttoff2 depending on in which oscilloscope the trigger occurred. The host can use the timestamp information along with its own address generator count to determine a consistent memory location for the trigger. If there are more than one trigger, and therefore more than one trigger timestamps ttoffs due to the host or client receiving a trigger event at nearly the same time, the host can utilize a tiebreaker decision to pick which ttoff value to use. The tie-breaker used by the host 100 can be very simple. For example, a pre-designated priority may be set, such as the host 100 is first followed by clients in order, or the trigger signals can be sent from the clients to a common point in the host where the first trigger event can be determined more accurately.

As noted above, the TrigSyncClock and DigSyncClock are phase aligned to each other within the host or clients. Communication of the AcqReady signal to the acquisition controller 108 from the digitizer 110 within the host is synchronized by the SyncClocks within the host. As is presently done in digital oscilloscopes at startup, a divider that makes the DigSyncClock is bumped until its rising edge is about halfway between the rising edges of the TrigSyncClock. Doing so ensures that the Run and AcqReady signals are received consistently from the acquisition controller 108 from one acquisition to the next, and from one power-up cycle to the next.

Since an oscilloscope always has more than one digitizer, it should be ensured that these digitizers have the same phase from one power up to the next. The SyncClock procedure only gets the phase alignment of the digitizers to within a half timebase clock due to the possibility of having a metastable at one of the DigSyncClock phases which can cause uncertainty in the final bumped phase of the DigSyncClock. To resolve this, a calibration signal, such as a fast edge, square wave, or impulse signal, may be transmitted to all of the digitizers to digitize the waveform. The system may then analyze the phase of the captured calibration signal and bump the DigSyncClock an extra cycle, as needed. That is, each of the DigSyncClocks are bumped until a setup time violation is observed, and then the DigSyncClock is bumped a fixed distance from the violation.

Phase alignment between the TrigSyncClocks and the DigSyncClocks within each client follows the same procedure described above in the host.

Phase alignment between the SyncClocks of different oscilloscopes follows the same principle described above, except the need is to phase align the TrigSyncClocks between different oscilloscopes to each other. As the TrigSyncClock phases are bumped, the respective DigSyncClock within an oscilloscope is bumped as well to maintain the internal consistency established above.

Although the TrigSyncClock 114 and DigSyncClock 112 are shown to be the same frequency in the timing diagrams of FIGS. 2-4 for simplicity, it is often the case that the period of the TrigSyncClock 114 will be a multiple of the DigSyncClock 112. The DigSyncClock 112 is chosen as fast as possible to support high update rates within individual oscilloscopes. However, this frequency is limited by propagation delays found within a single oscilloscope. This will, in general, be too fast for the propagation delays in cables between the oscilloscopes. Therefore, the TrigSyncClocks 114 may be slower, as needed. The TrigSyncClock 114 can be chosen to be something slower to accommodate the longest anticipated cable, or it can be determined dynamically at power up, as described in more detail below. This enables the individual oscilloscopes to still achieve high-update rate performance when used singly, while throttling the update rate only as needed for particular multi-oscilloscope configurations.

The phase of the client TrigSyncClock 114 is bumped until the propagation delay plus an appropriate setup time is achieved in the clients with respect to incoming Run_In events. As the phase in the client TrigSyncClock 114 is bumped, the client will observe a sudden large change in the latching of the Run_In signal. This change occurs as the arrival time of the Run_In signal changes from just before to just after the TrigSyncClock 114 transition.

There are multiple possible ways of observing this cycle slip. One way is seen in the timing diagrams of FIGS. 2-4 is the returning AcqReady1_In signal would slip a full clock period. An alternative way would be to re-synchronize Run2_Out before returning it to the host 100. Once this metastable point is found, the client, under control of the host 100, may then further delay the TrigSyncClock 114 some appropriate fixed amount to ensure proper setup time. Assuming that the TrigSyncClock 114 frequency is chosen slow enough, doing this also guarantees that communication, such as Run and AcqReady, from the clients to the host are also received consistently and synchronously.

By bumping the client TrigSyncClock 114 phases through their entire range, the necessary period of the TrigSyncClock 114 can be inferred. However, this is slow and iterative. To make this process easier and quicker, and to enable its implementation in equipment that doesn't have a digitizer, a ring-oscillator step system shown in FIG. 5 may be used and is discussed below.

Figure 5:
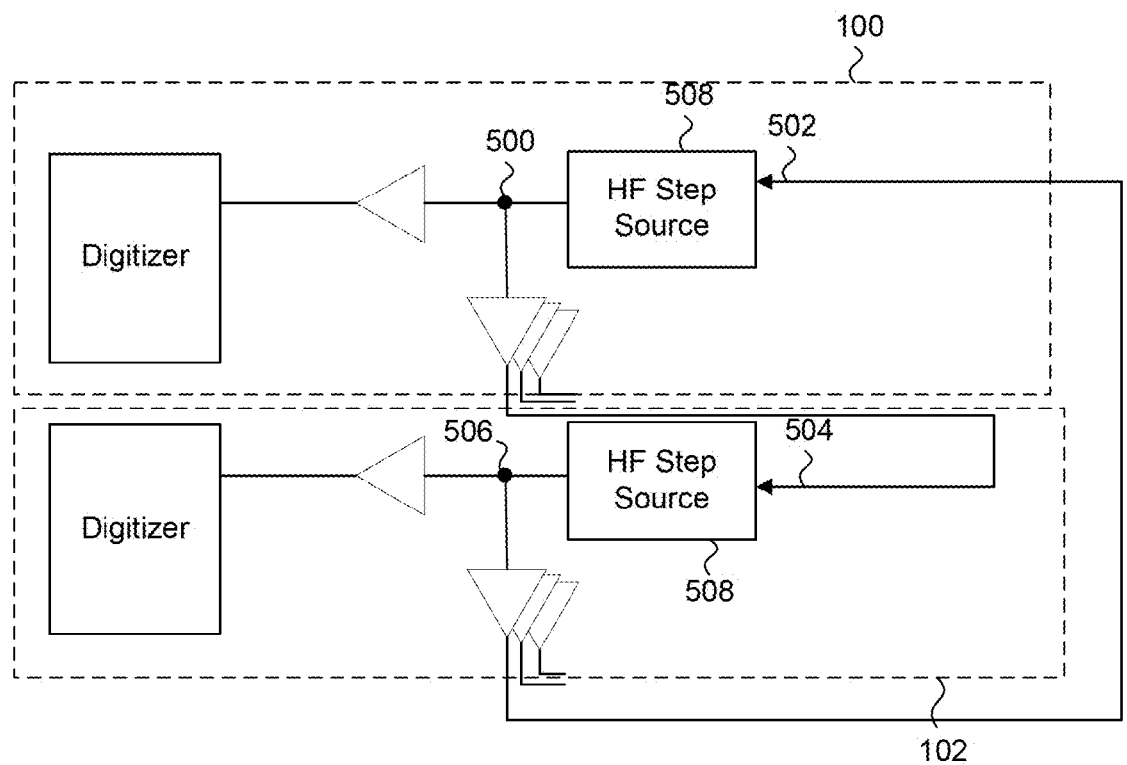
FIG. 5 is the ring oscillator calibration system for calibrating the skew between the host and client digitizers.
Figure 6:
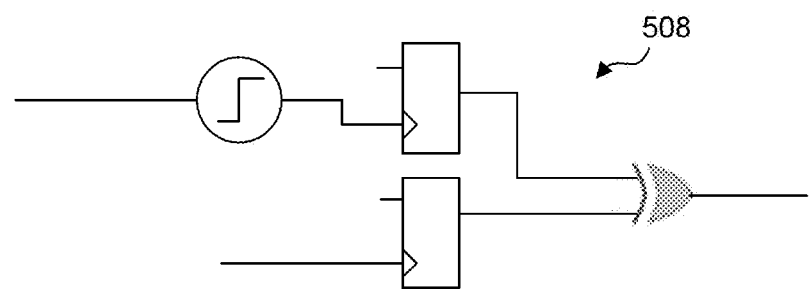
FIG. 6 is an example of a high frequency step source for use in the system of FIG. 5.

FIG. 5 shows a simplified diagram of the ring-oscillator step used to determine the delay between instruments. In one embodiment, HF Step source 508 is configured as shown in FIG. 6 in both the host 100 and the client 102. A rising edge is initiated on the host 100, while the clients (in FIG. 6, client 102) keep their edge low, which causes a fast edge to appear at 500 and later at 504. This delay is shown at 800 in FIG. 8. The edge passes through the XOR gate and appears at 506 after a propagation delay of 802. The edges passes back to the host 100 at 502 and is received after a propagation delay of 804. The edge gets inverted by the XOR gate in the host 100 and the cycle repeats thus forming a ring oscillator whose time period equals 2*(800+802+806+806).

Figure 7:
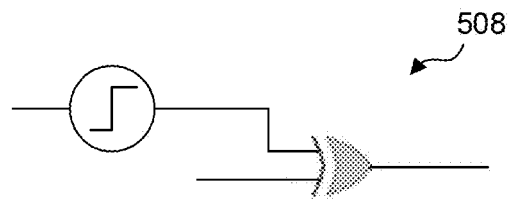
FIG. 7 is an alternative example of a high frequency step source for use in the system of FIG. 5.

In an alternative embodiment, the HF Step source can be configured as shown in FIG. 7. The timing diagram looks the same except instead of measuring the ring oscillator frequency, the pulse is digitized in the host 100 where the width is measured.

By configuring a high frequency (HF) step source into a ring oscillator configuration, it's quick and easy to determine the approximate lengths of the cables between the oscilloscopes. The set of six signals comprising the HF Step In, HF Step Out, AcqReady_In, AcqReady_Out, Run_In, and Run_Out between the host and clients are assumed to be fairly well-matched because they are contained within the same cable. However, no matching requirement is needed or even advantageous between sets to different clients.

Figure 8:
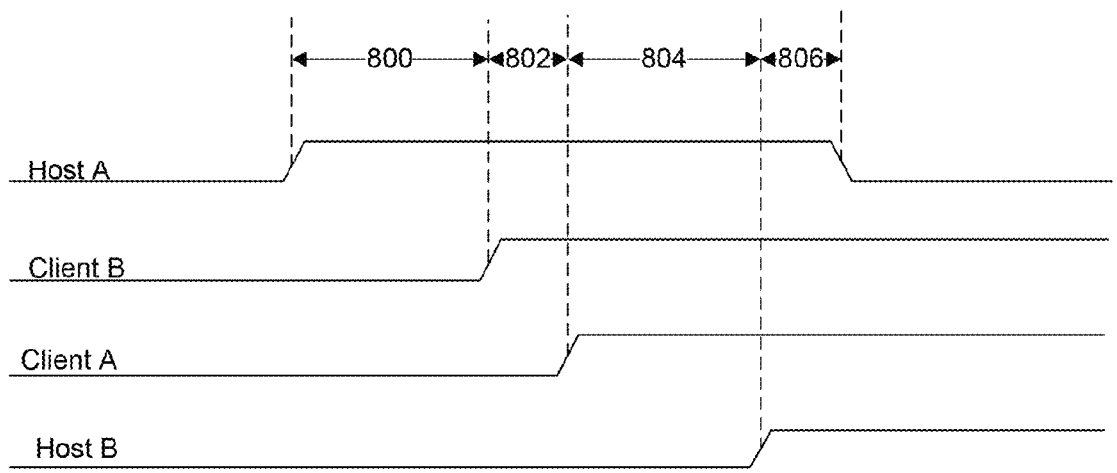
FIG. 8 is a timing chart for the high frequency step ring oscillator calibration system of FIG. 5.

To facilitate setting of the TrigSyncClock 114, the delay between the host 100 and the client 102 HF steps can be determined by measuring the width of the digitized pulse in the host as shown in FIG. 8 using the digitizer. The pulse is originated by the host and propagates through the client and is terminated by the pulse arriving back at the host and is approximately twice the cable delay. This is repeated for each host and client pair. Alternatively (and preferably), if the latch is removed in the HF Step source 508, a ring oscillator is formed between the client and host, as seen in FIG. 5. The period of the oscillation is then twice the round trip propagation delay between the oscilloscopes. A timer-counter could be constructed in the host controller to precisely and quickly measure this clock period. Such a technique is useful in situations where the client has no ability to digitize or timestamp the HF step signal.

To the extent matching isn't possible, the frequency of the TrigSyncClocks 114 must be slowed down as needed to ensure margin for the longest cable set. Note that the DigSyncClock frequencies remain unchanged. These are fixed within each oscilloscope and set by internal timing requirements. This TrigSyncClock 114 period must always be an integer multiple of the DigSyncClock 112 period. This system allows dissimilar oscilloscope models with different internal DigSyncClock periods to still take advantage of this technology. This also enables backward and forward compatibility between different generations of oscilloscopes. The requirements in such a case is the TrigSyncClock 114 period must be an integer multiple of all of the DigSyncClock periods in the different oscilloscopes.

By knowing the round trip distance from the host to a client and back again, an approximation is determined of the one-way distance by assuring the lengths of the HF steps are as well matched as possible in each direction. Given this information, when the digitizer in the host and a client each receive the HF step signal, the approximate relative times the steps were received is known and therefore the relative delays between the oscilloscopes are known.

The matched delay will be maintained from one power up cycle to the next as long as the same set of cables are used. If the cable set is changed or re-arranged between power-up cycles, the above discussed delay measuring sequence should be repeated to ensure synchronous communication between oscilloscopes.

If a user desires extremely accurate phase alignment between oscilloscopes, a known-matched pair of signals is fed into one channel on the host and one channel on the client. By measuring the relative delay between the digitized signals, the precise relative delay between the oscilloscopes is known. By comparing this measurement with what is obtained with the HF step calibration signal, this precise alignment will be maintained between power cycles. This is similar to the procedure that is employed at the factory to align channels within a single oscilloscope. Because the internal interconnect between digitizers cannot be altered by the user, calibration within an oscilloscope never needs to be repeated.

The disclosed technology works for arbitrary cable distances between oscilloscopes without sacrificing high update-rate performance of the oscilloscopes when used as stand-alone units. Further, with the disclosed technology, jitter between the digitizing channels between the different oscilloscopes is similar to jitter between channels within one oscilloscope. The disclosed technology also works for different oscilloscope models, even if the internal clocking architectures are different; therefore, backward and forward compatibility are supported. Further, the oscilloscopes may easily be configured as host or client by the user.

Having described and illustrated the principles of the disclosed technology in a preferred embodiment thereof, it should be apparent that the disclosed technology can be modified in arrangement and detail without departing from such principles. We claim all modifications and variations coming within the spirit and scope of the following claims.

The invention claimed is:
1. A test and measurement system for synchronizing multiple oscilloscopes, comprising:
  a host oscilloscope including:
    a host timebase clock configured to output a clock signal,
    a host digitizer, coupled with the host timebase clock, configured to determine a digitizer synchronization clock based on the clock signal, and
    a host acquisition controller, coupled with the host timebase clock and the host digitizer, configured to determine a trigger synchronization clock based on the clock signal, and further configured to output, based on the trigger synchronization clock, a run signal to cause the host oscilloscope to begin an acquisition of an input signal based on the digitizer synchronization clock; and at least one client oscilloscope, coupled with the host oscilloscope, each client oscilloscope including:

a client timebase clock configured to receive the clock signal from the host timebase clock and output the clock signal, a client digitizer, coupled with the client timebase clock, configured to determine a client digitizer synchronization clock based on the clock signal, and a client acquisition controller, coupled with the client timebase clock and the client digitizer, configured to determine a client synchronization clock based on the clock signal, and further configured to receive the run signal from the host acquisition controller and begin an acquisition of another input signal based on the run signal, wherein the client acquisition controller of each client oscilloscope is configured to output an acquisition ready signal when the respective client oscilloscope is ready to begin an acquisition and the host acquisition controller is further configured to output the run signal when the acquisition ready signal has been received from each of the client oscilloscopes.

2. The test and measurement system of claim 1, wherein the host oscilloscope and each of the client oscilloscopes further includes a trigger, each trigger configured to output a trigger signal and each of the host oscilloscope and client oscilloscopes are configured to output a stop acquisition signal based on the trigger signal, and the host acquisition controller is configured to output the stop acquisition signal to each of the client oscilloscopes in the test and measurement system based on the stop acquisition signal.

3. The test and measurement system of claim 1, wherein the digitizer synchronization clock of the host oscilloscope and each client oscilloscope and the trigger synchronization clock of the host oscilloscope and each client oscilloscope are the same frequency.

4. The test and measurement system of claim 1, wherein the trigger synchronization clock period of each client oscilloscope is a multiple of the digitizer synchronization clock period of the host oscilloscope.

5. The test and measurement system of claim 1, comprising at least two client oscilloscopes and wherein the trigger synchronization clock period of the host oscilloscope is a smallest common multiple of all of the digitizer synchronization clock periods in the at least two client oscilloscopes.

6. The test and measurement system of claim 1, wherein a phase of each digitizer synchronization clock is advanced until a rising edge of the digitizer synchronization clock is halfway between a high output of each trigger synchronization clock.

7. The test and measurement system of claim 1, wherein a phase of each trigger synchronization clock is set based on a calibration signal.

8. The test and measurement system of claim 1, wherein the trigger synchronization clock frequency of each client oscilloscope is further based on an absolute delay between the host oscilloscope and each client oscilloscope.

9. A method of synchronizing a plurality of oscilloscopes, the method comprising:

outputting, from a host oscilloscope, a host clock signal to a client oscilloscope:

setting, by the host oscilloscope, a host digitizer synchronization clock based on the host clock signal;

setting, by the host oscilloscope, a host trigger synchronization clock based on the host clock signal;

receiving, by the host oscilloscope, an acquisition ready signal from the client oscilloscope;

in response to receiving the acquisition ready signal, generating, by the host oscilloscope, a run signal based on the host trigger synchronization clock;

outputting the run signal to the client oscilloscope to cause the client oscilloscope to begin acquisition of a first input signal; and starting an acquisition of a second input signal at the host oscilloscope based on the host digitizer synchronization clock.

10. The method of claim 9, further comprising:

receiving a trigger signal at the host oscilloscope; and outputting, by the host oscilloscope, a stop acquisition signal to the client oscilloscope in response to receiving the trigger signal, the stop acquisition signal to cause the client oscilloscope to stop acquisition of the first input signal.

11. The method of claim 9, further comprising:

receiving, by the host oscilloscope, a trigger signal from the client oscilloscope; and outputting, by the host oscilloscope, a stop acquisition signal in response to receiving the trigger signal, the stop acquisition signal to cause the client oscilloscope to stop acquisition of the first input signal.

12. The method of claim 9, wherein the host oscilloscope outputs the host clock signal to at least two client oscilloscopes and the host trigger synchronization clock period is a smallest common multiple of all of the client digitizer synchronization clock periods of the at least two client oscilloscopes.

13. A method of synchronizing a plurality of oscilloscopes, the method comprising, at a client oscilloscope:

receiving a host clock signal of a host oscilloscope;

setting a client digitizer synchronization clock based on the host clock signal;

setting a client trigger synchronization clock based on the host clock signal;

outputting an acquisition ready signal to the host oscilloscope, the acquisition ready signal indicative of a readiness of the client oscilloscope to begin acquisition of an input signal;

receiving a host run signal from the host oscilloscope in response to the acquisition ready signal;

based on the client trigger synchronization clock, generating a client run signal; and starting an acquisition of the input signal based on the host run signal, the client run signal, and the client digitizer synchronization clock.

14. The method of claim 13, further comprising, at the client oscilloscope:

generating a trigger signal;

outputting a first stop acquisition signal in response to the trigger signal;

receiving from the host oscilloscope a second stop acquisition signal; and stopping the acquisition in response to the second stop acquisition signal.

* * * * *